US012628279B2

(12) United States Patent　　(10) Patent No.:　US 12,628,279 B2
Shimizu　　(45) Date of Patent:　May 12, 2026

(54) CONDUCTIVE MODULE

(71) Applicant: YAZAKI CORPORATION, Tokyo (JP)

(72) Inventor: Hidehiko Shimizu, Makinohara (JP)

(73) Assignee: YAZAKI CORPORATION, Tokyo (JP)

( * ) Notice: Subject to any disclaimer, the term of this patent is extended or adjusted under 35 U.S.C. 154(b) by 530 days.

(21) Appl. No.: 18/320,961

(22) Filed: May 19, 2023

(65) Prior Publication Data

US 2023/0389188 A1　Nov. 30, 2023

(30) Foreign Application Priority Data

May 26, 2022　(JP) ................................. 2022-085747

(51) Int. Cl.
 *H05K 1/189*　　(2026.01)
 *H01M 50/519*　　(2021.01)
 *H01M 50/588*　　(2021.01)
(52) U.S. Cl.
 CPC .......... *H05K 1/189* (2013.01); *H01M 50/519* (2021.01); *H01M 50/588* (2021.01); *H05K 2201/10022* (2013.01); *H05K 2201/10151* (2013.01); *H05K 2201/10181* (2013.01); *H05K 2201/10272* (2013.01); *H05K 2201/10636* (2013.01); *H05K 2201/2009* (2013.01); *H05K 2201/2018* (2013.01)
(58) Field of Classification Search
 CPC ......... H05K 1/189; H05K 2201/10022; H05K 2201/10151; H05K 2201/10181; H05K 2201/10272; H05K 2201/10636; H05K 2201/2009; H05K 2201/2018; H05K 2201/10977; H05K 2203/1322; H05K 3/284; H05K 1/028; H05K 1/0281; H05K 1/0296; H05K 1/111; H01M 50/519; H01M 50/588; H01M 10/425
 See application file for complete search history.

(56) References Cited

U.S. PATENT DOCUMENTS 6,350,953 B1 * 2/2002 Franzen .................. H01L 23/13
　　　　　　　　　　　　　　　　　　29/841
2002/0185752 A1 * 12/2002 Ishikawa ............. H01L 23/3121
　　　　　　　　　　　　　　　　　　257/E23.125
2019/0178904 A1 * 6/2019 Braman ............... H05K 1/0271

FOREIGN PATENT DOCUMENTS

JP　　　　2002-93995 A　　3/2002

* cited by examiner

*Primary Examiner* — Stewart A Fraser
(74) *Attorney, Agent, or Firm* — KENEALY VAIDYA LLP

(57)　　　　ABSTRACT

A conductive module includes: a flexible printed wiring board; an electronic component that is mounted on the flexible printed wiring board and connected to a circuit pattern of the flexible printed wiring board; a first potting agent that covers a connection part between the electronic component and the flexible printed wiring board; and a second potting agent that overlaps the first potting agent from the opposite side of the flexible printed wiring board, and covers the first potting agent and the electronic component. The first potting agent has higher flexibility as compared with the second potting agent.

8 Claims, 11 Drawing Sheets

CONDUCTIVE MODULE

CROSS-REFERENCE TO RELATED APPLICATION(S)

The present application claims priority to and incorporates by reference the entire contents of Japanese Patent Application No. 2022-085747 filed in Japan on May 26, 2022.

BACKGROUND OF THE INVENTION

1. Field of the Invention

The present invention relates to a conductive module.

2. Description of the Related Art

In the related art, there is known a conductive module including a flexible printed wiring board. Japanese Patent Application Laid-open No. 2002-093995 discloses a technique of configuring a power circuit board in which each busbar made of a metallic body is arranged on a surface of a metal board via a flexible board, an IGBT is connected to each busbar, and a three-phase inverter circuit is mounted. In the conductive module in which an electronic component is mounted on the flexible printed wiring board, it is desirable to protect a connection part between the electronic component and the flexible printed wiring board.

SUMMARY OF THE INVENTION

The present invention aims at providing a conductive module that can protect the connection part between the electronic component and the flexible printed wiring board.

In order to achieve the above mentioned object, a conductive module according to one aspect of the present invention includes a flexible printed wiring board; an electronic component that is mounted on the flexible printed wiring board and connected to a circuit pattern of the flexible printed wiring board; a first potting agent that covers a connection part between the electronic component and the flexible printed wiring board; and a second potting agent that overlaps the first potting agent from the opposite side of the flexible printed wiring board, and covers the first potting agent and the electronic component, wherein the first potting agent has higher flexibility as compared with the second potting agent.

The above and other objects, features, advantages and technical and industrial significance of this invention will be better understood by reading the following detailed description of presently preferred embodiments of the invention, when considered in connection with the accompanying drawings.

DETAILED DESCRIPTION OF THE PREFERRED EMBODIMENTS

The following describes a conductive module according to an embodiment of the present invention in detail with reference to the drawings. The present invention is not limited to the embodiment. Constituent elements in the following embodiment encompass a constituent element that is easily conceivable by those skilled in the art, or substantially the same constituent element.

Embodiment

Figure 1:
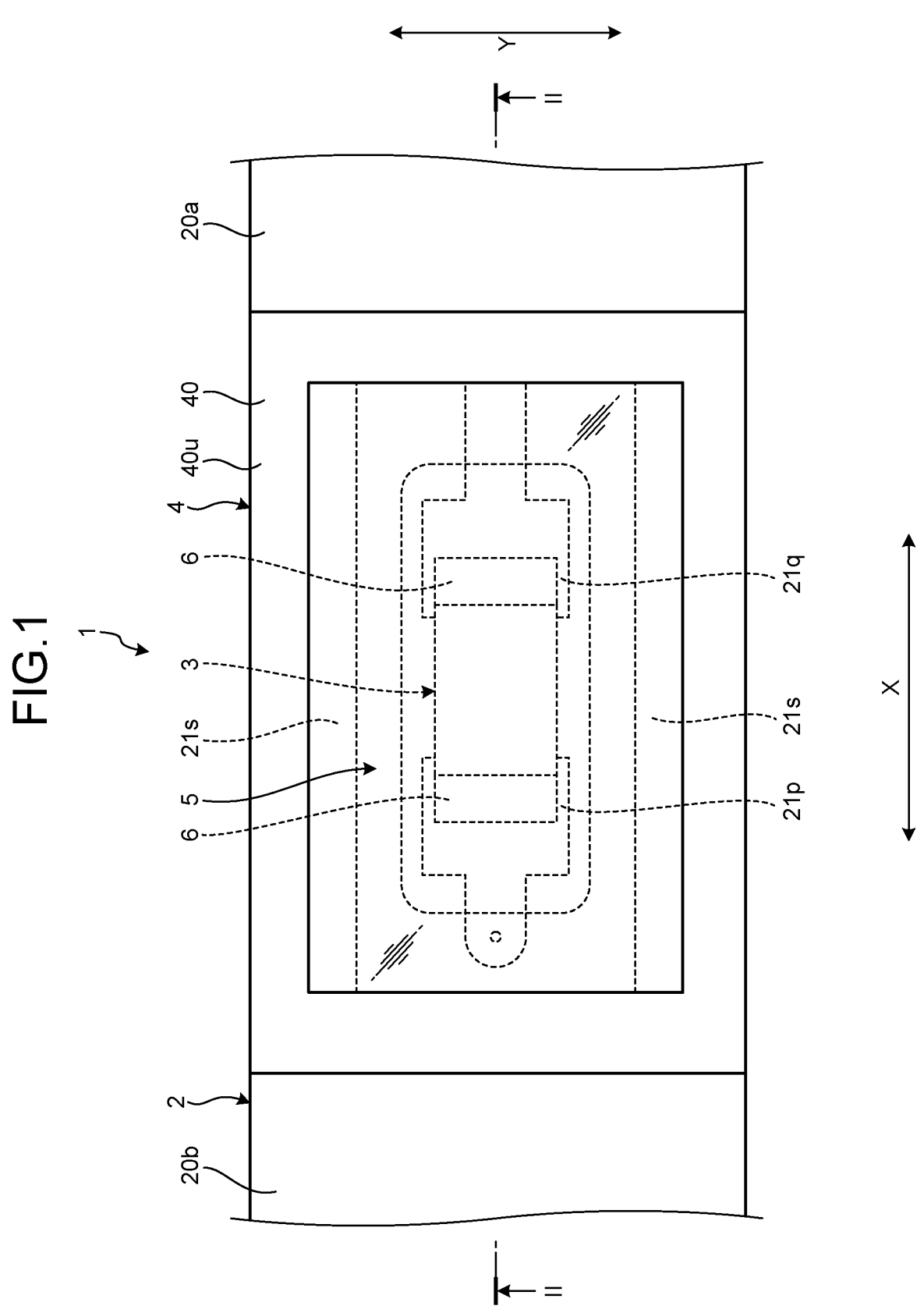
FIG. 1 is a plan view of a conductive module according to an embodiment.
Figure 2:
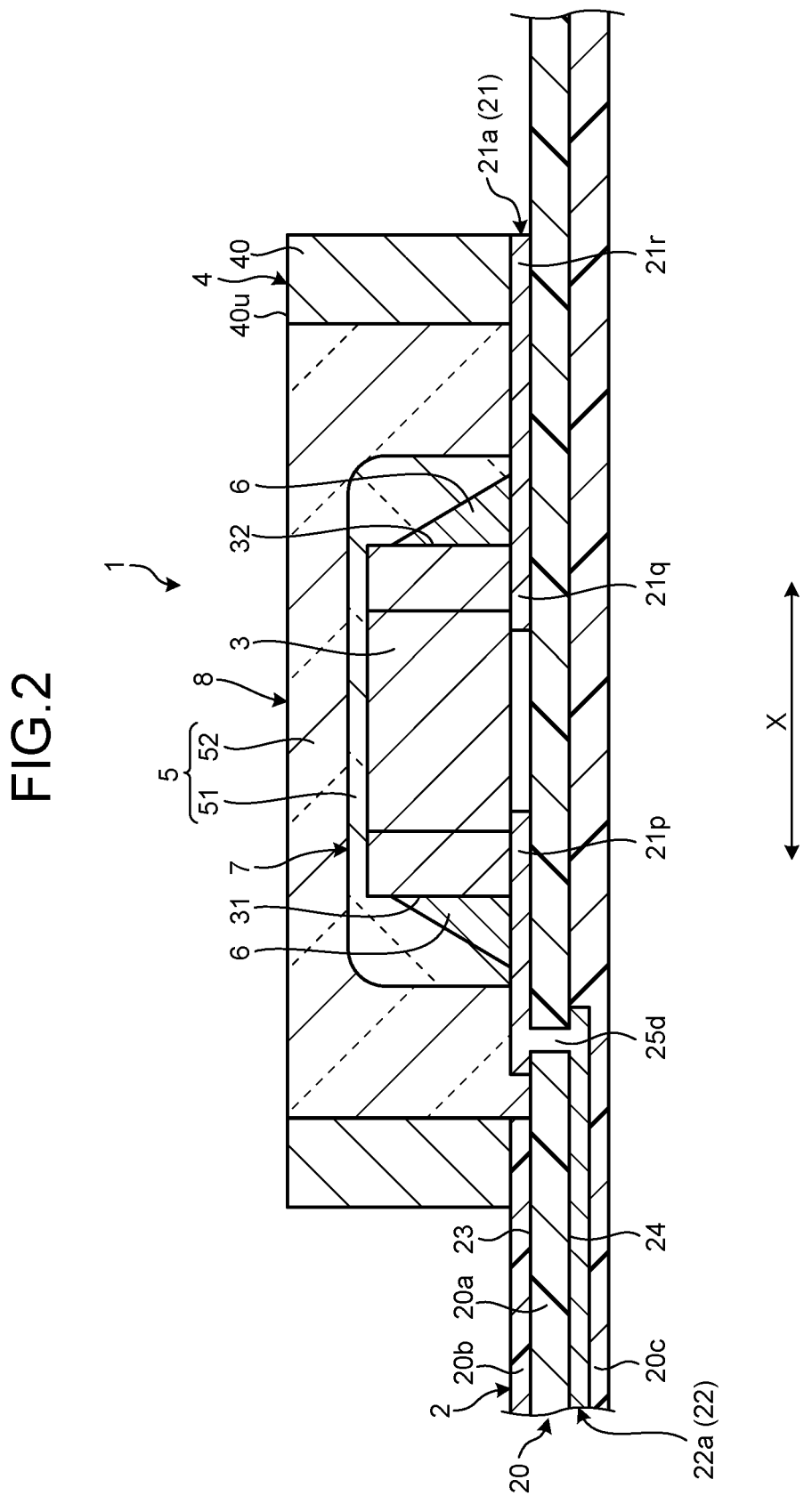
FIG. 2 is a cross-sectional view of the conductive module according to the embodiment.
Figure 3:
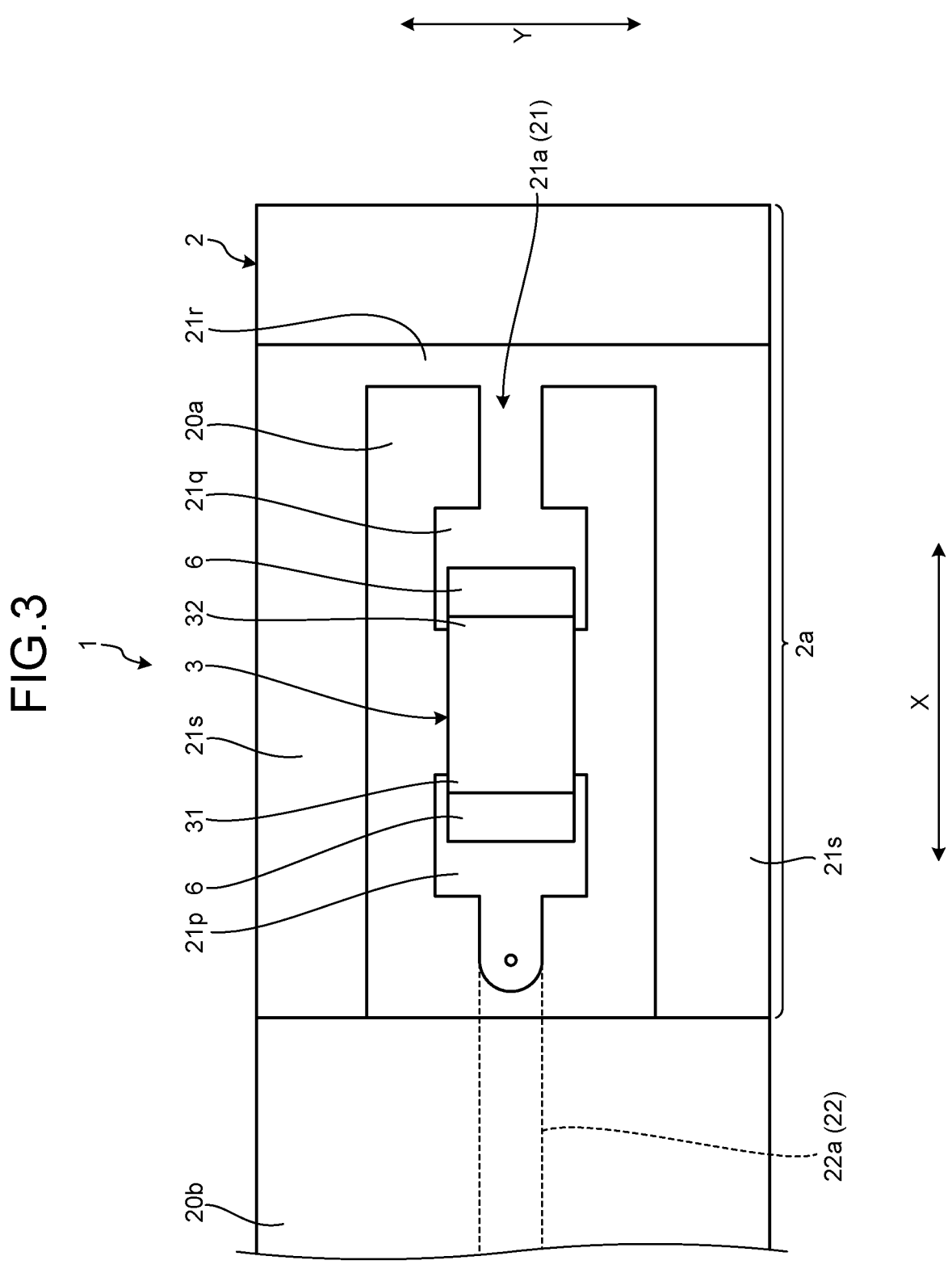
FIG. 3 is a plan view of the conductive module before a potting layer is formed.
Figure 4:
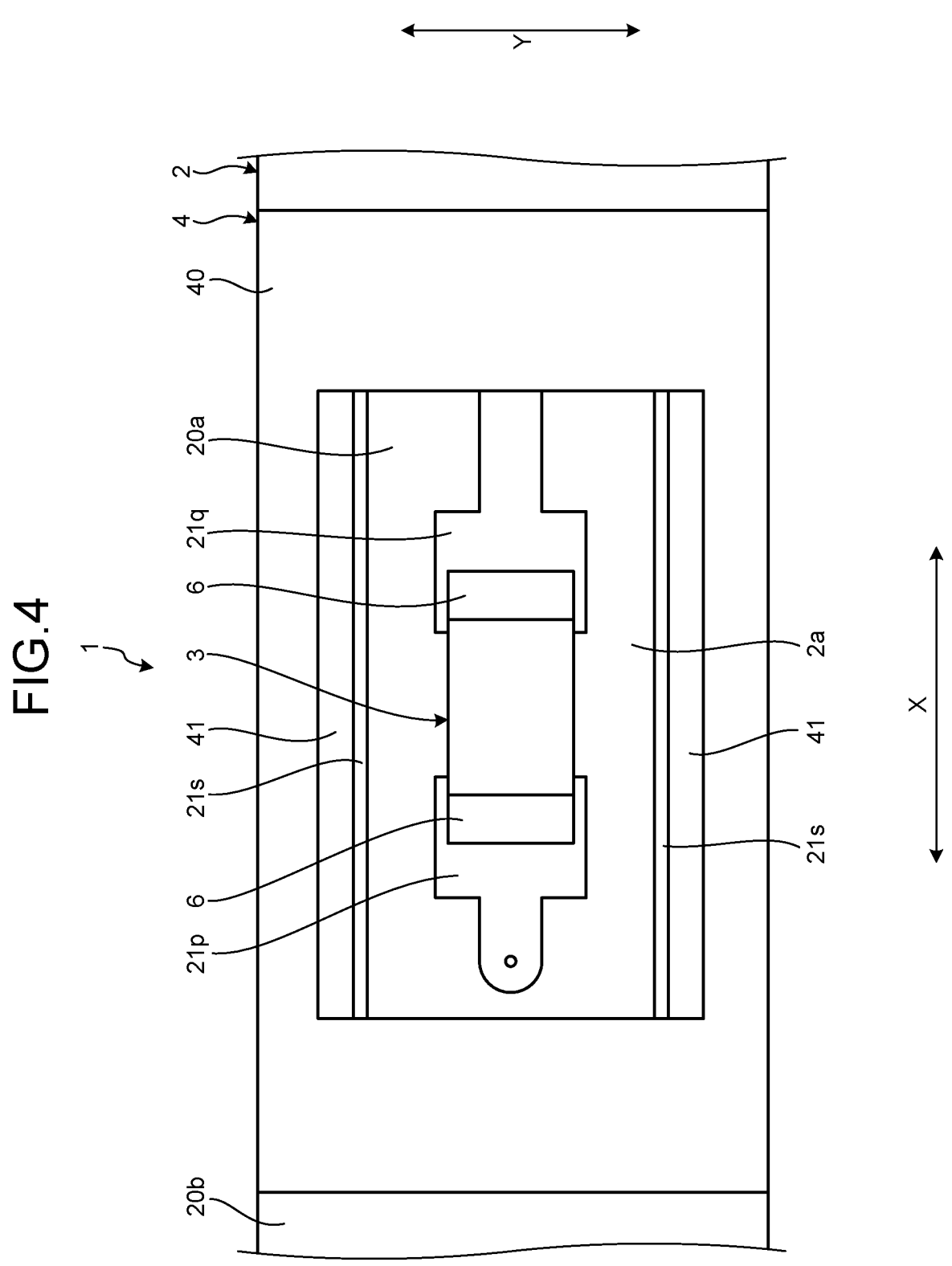
FIG. 4 is a plan view of the conductive module to which a metal plate is attached.
Figure 5:
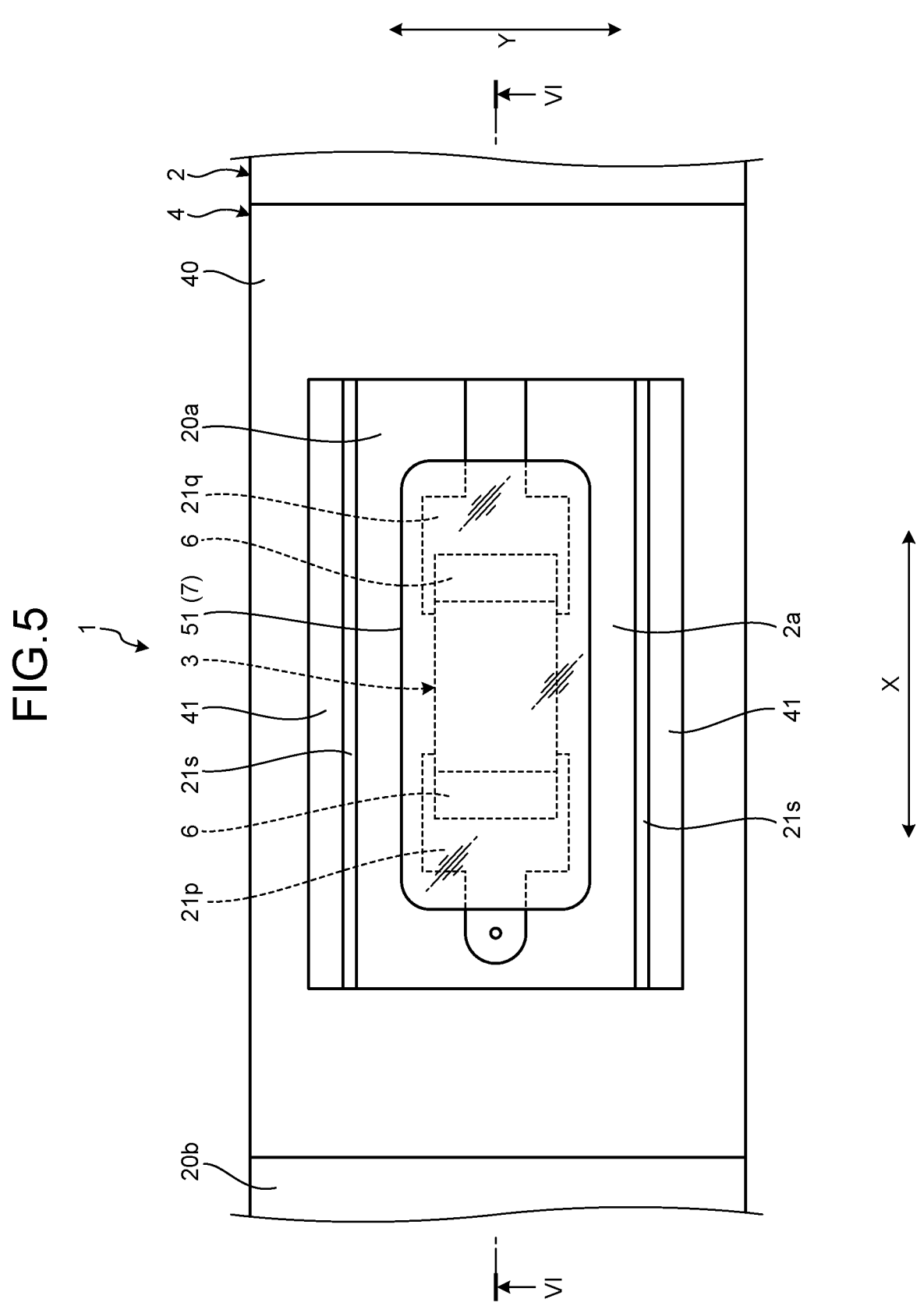
FIG. 5 is a plan view of the conductive module to which a first potting agent is applied.
Figure 6:
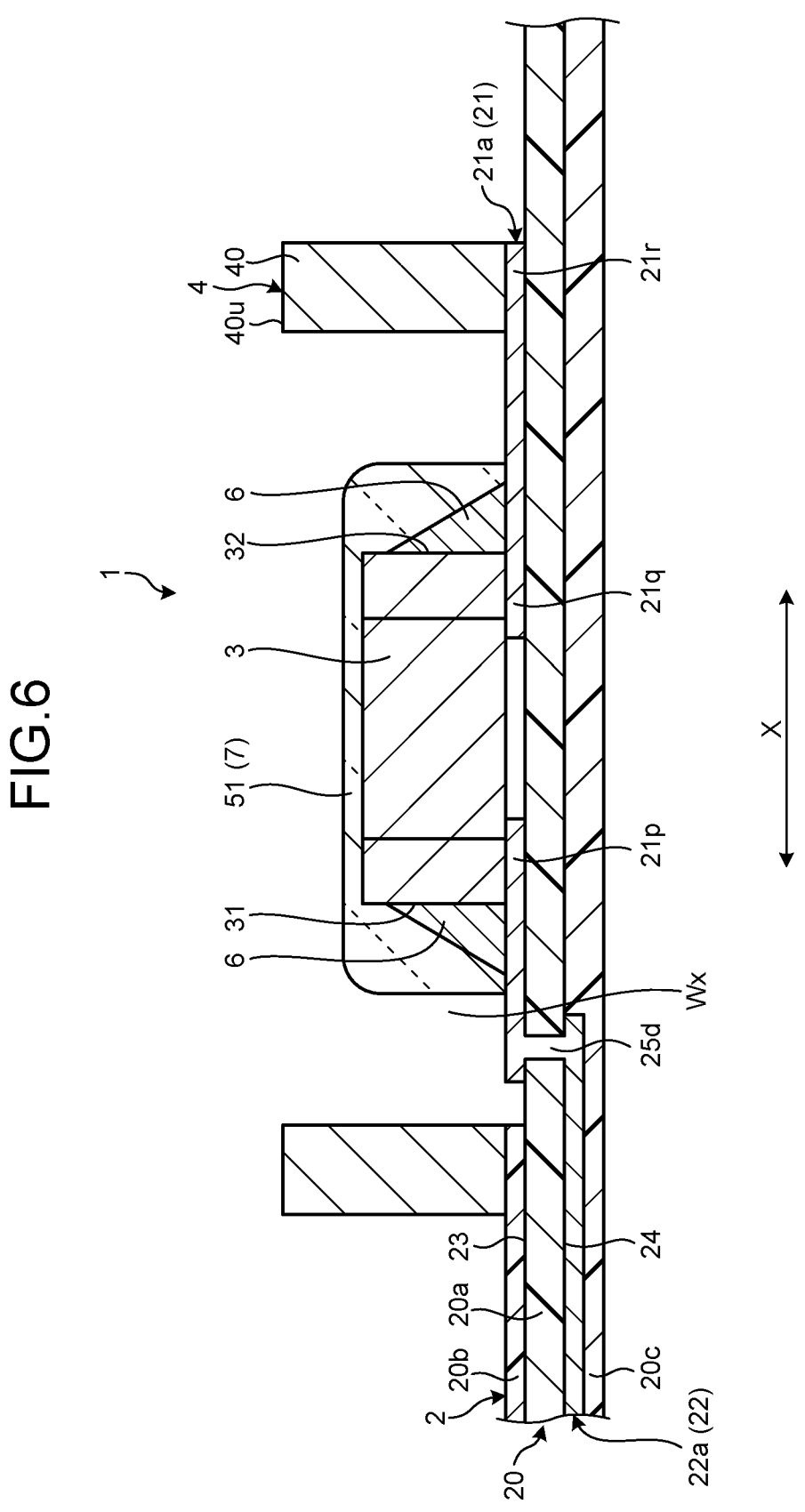
FIG. 6 is a cross-sectional view of the conductive module to which the first potting agent is applied.
Figure 7:
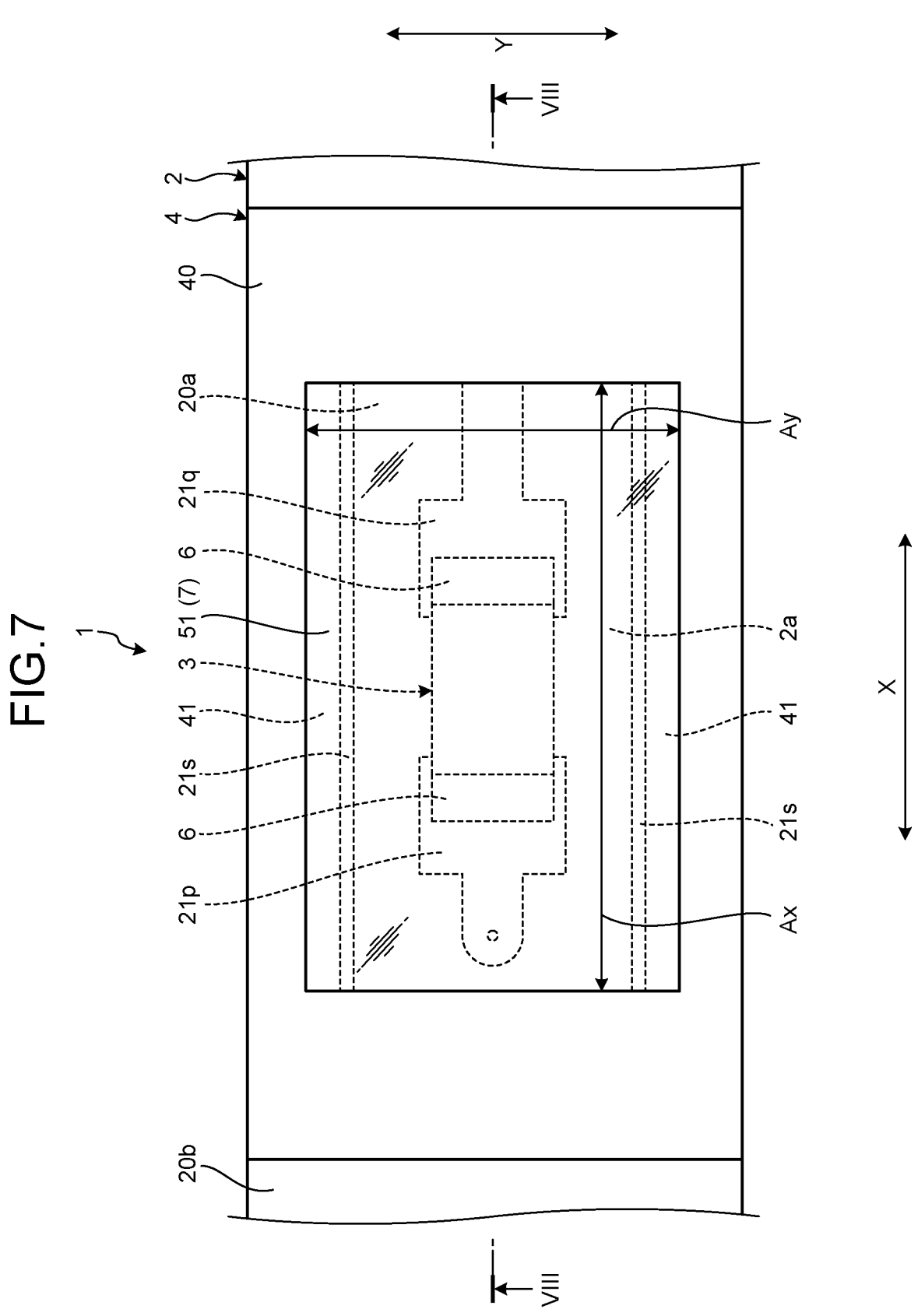
FIG. 7 is a plan view of the conductive module to which the first potting agent is applied.
Figure 8:
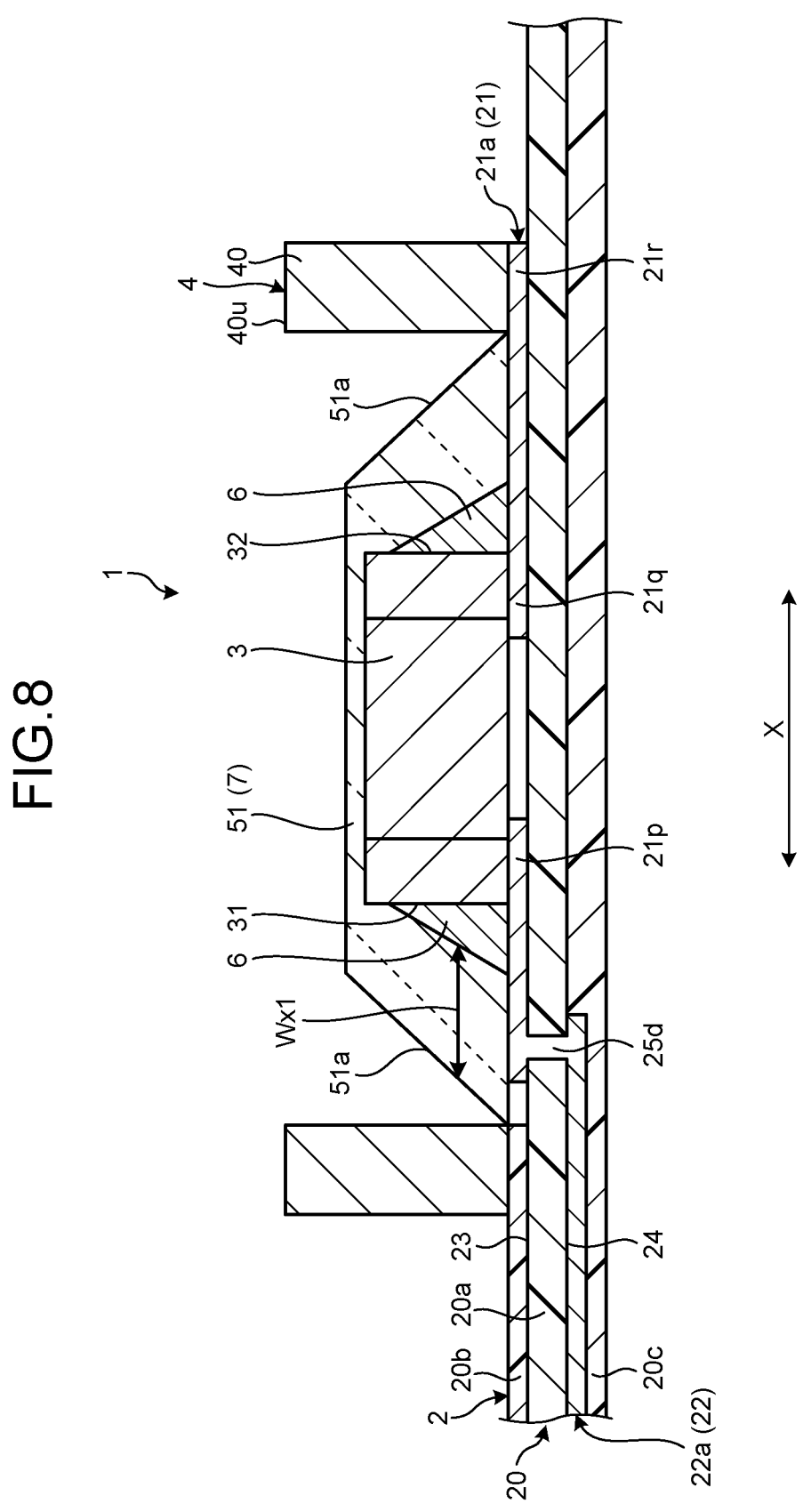
FIG. 8 is a cross-sectional view of the conductive module to which the first potting agent is applied.
Figure 9:
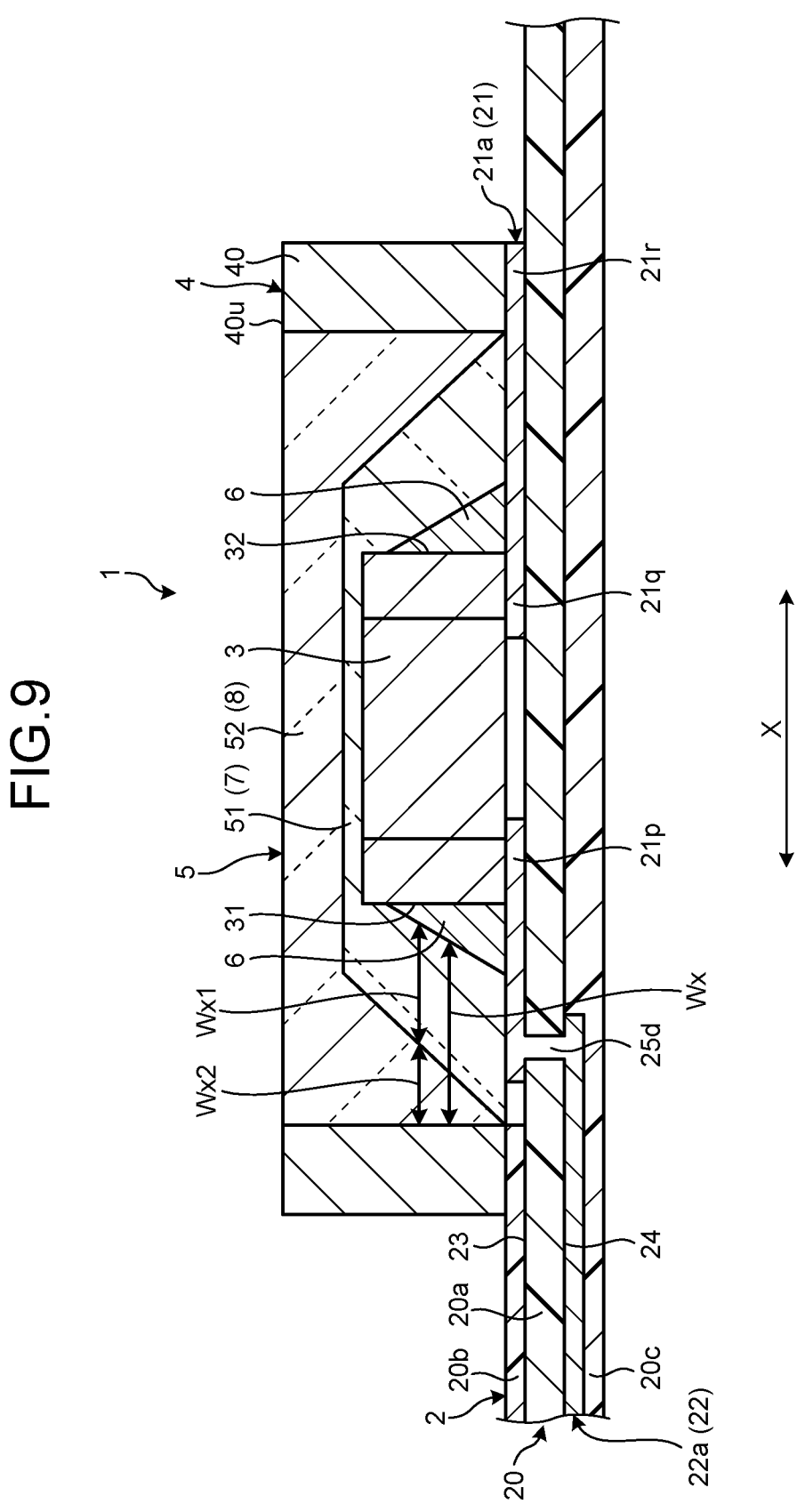
FIG. 9 is a cross-sectional view of the conductive module according to the embodiment.
Figure 10:
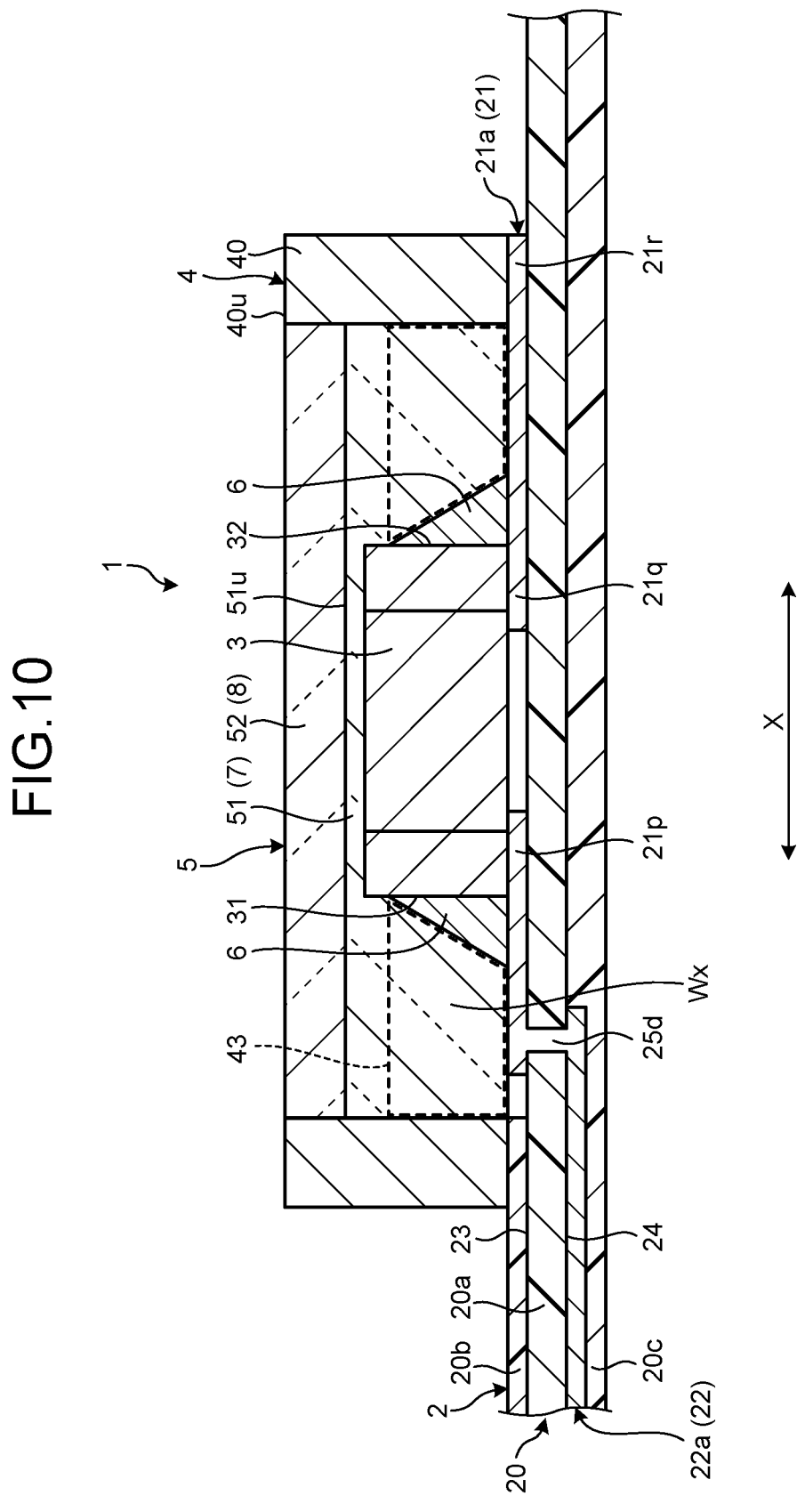
FIG. 10 is a cross-sectional view of the conductive module according to the embodiment.
Figure 11:
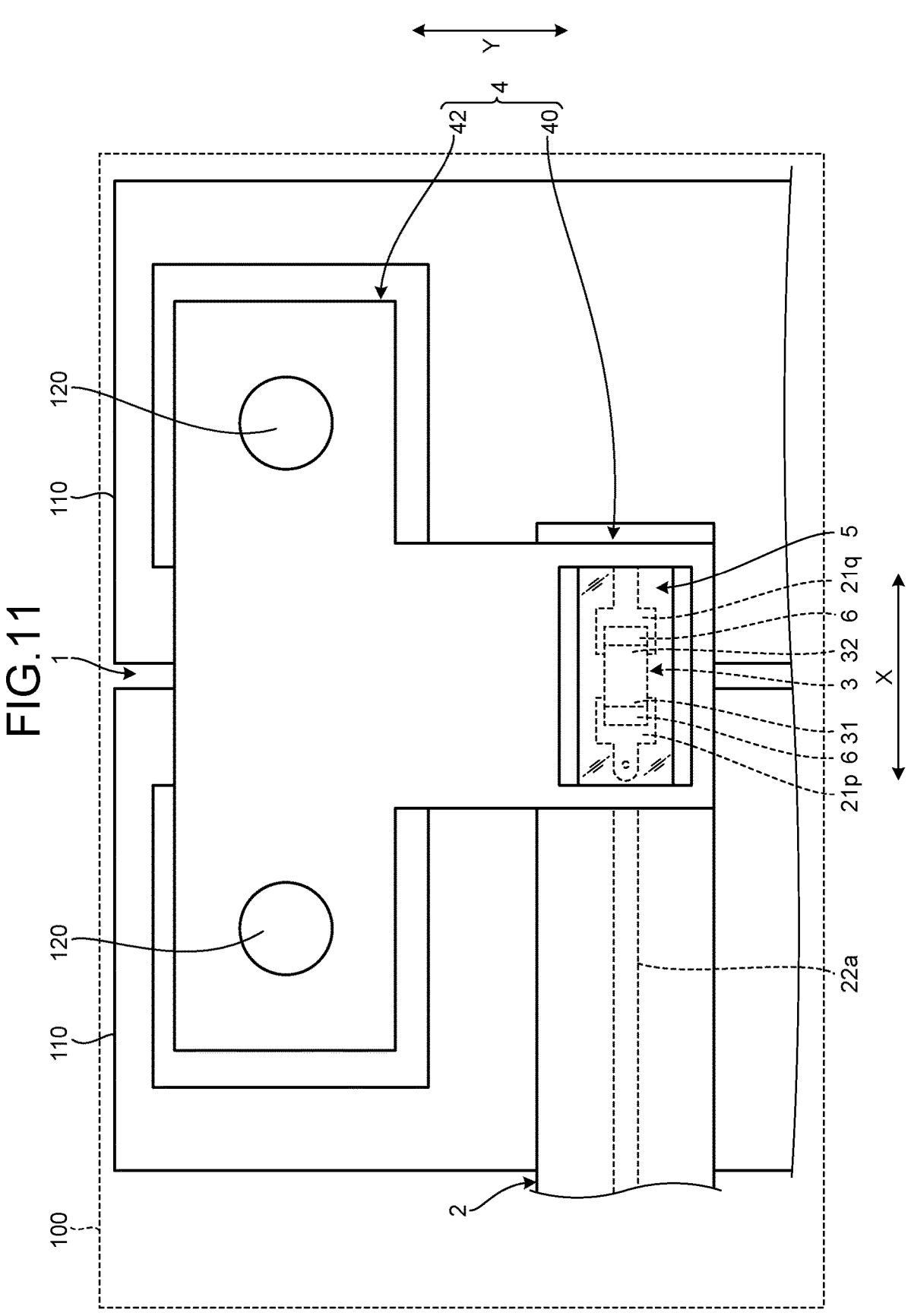
FIG. 11 is a plan view of the conductive module according to the embodiment.

With reference to FIG. 1 to FIG. 11, the following describes the embodiment. The present embodiment relates to a conductive module. FIG. 1 is a plan view of the conductive module according to the embodiment, FIG. 2 is a cross-sectional view of the conductive module according to the embodiment, FIG. 3 is a plan view of the conductive module before a potting layer is formed, FIG. 4 is a plan view of the conductive module to which a metal plate is attached, FIG. 5 is a plan view of the conductive module to which the first potting agent is applied, FIG. 6 is a cross-sectional view of the conductive module to which the first potting agent is applied, FIG. 7 is a plan view of the conductive module to which the first potting agent is applied, FIG. 8 is a cross-sectional view of the conductive module to which the first potting agent is applied, FIG. 9 and FIG. 10 are cross-sectional views of the conductive module according to the embodiment, and FIG. 11 is a plan view of the conductive module according to the embodiment.

FIG. 2 illustrates a II-II cross section of FIG. 1. FIG. 6 illustrates a VI-VI cross section of FIG. 5. FIG. 8 illustrates a VIII-VIII cross section of FIG. 7.

As illustrated in FIG. 1 and FIG. 2, a conductive module 1 according to the present embodiment includes a flexible printed wiring board 2, an electronic component 3, a metal plate 4, and a potting layer 5. The flexible printed wiring board 2 is a printed board having flexibility. In the following description, a longitudinal direction of the flexible printed wiring board 2 is referred to as a "first direction X", and a width direction thereof is referred to as a "second direction Y".

FIG. 3 illustrates the flexible printed wiring board 2 on which the electronic component 3 is mounted, and to which the metal plate 4 is not attached. At this point, the potting layer 5 is not formed on the flexible printed wiring board 2.

As illustrated in FIG. 2, the flexible printed wiring board 2 includes a resin layer 20, a first conductive layer 21, and a second conductive layer 22. The resin layer 20 is formed of a synthetic resin having an insulation property. The resin layer 20 includes a base film 20a, a first coverlay 20b, and a second coverlay 20c. The first conductive layer 21 is arranged on a first surface 23 of the base film 20a, and the second conductive layer 22 is arranged on a second surface 24 of the base film 20a. The first surface 23 is a surface on a side on which the electronic component 3 is mounted. The second surface 24 is a surface of the base film 20a on the opposite side of the first surface 23. The first coverlay 20b covers the first conductive layer 21 and the first surface 23. The second coverlay 20c covers the second conductive layer 22 and the second surface 24.

The first conductive layer 21 and the second conductive layer 22 are metal layers having electrical conductivity arranged inside the resin layer 20, for example, metal foil. The first conductive layer 21 constitutes a circuit pattern 21a, and the second conductive layer 22 constitutes a circuit pattern 22a. As illustrated in FIG. 3, the circuit pattern 21a includes a first pad 21p, a second pad 21q, an opposed part 21r, and a pair of pads 21s. The first pad 21p and the second pad 21q are pads connected to the electronic component 3. The first pad 21p and the second pad 21q are arranged to be separated from each other in the first direction X. As illustrated in FIG. 2, the first pad 21p is connected to the second conductive layer 22 via a via hole 25d.

The second pad 21q is continuous with the opposed part 21r. As illustrated in FIG. 3, the opposed part 21r extends from one end to the other end of the flexible printed wiring board 2 along the second direction Y. The pair of pads 21s are pads to which the metal plate 4 is connected. The two pads 21s are arranged at both end parts in the second direction Y. The pad 21s extends along the first direction X. The pad 21s is connected to an end part of the opposed part 21r.

As illustrated in FIG. 3, in the flexible printed wiring board 2, an exposed region 2a is disposed at a portion on which the electronic component 3 is mounted. In the exposed region 2a, the first coverlay 20b is peeled off, and the circuit pattern 21a and the base film 20a are exposed. That is, the first pad 21p, the second pad 21q, the opposed part 21r, and the pair of pads 21s are respectively exposed.

The electronic component 3 is mounted on the flexible printed wiring board 2, and connected to the circuit pattern 21a. The electronic component 3 is a component including a first terminal part 31 and a second terminal part 32, and may be a chip component. The electronic component 3 is, for example, a fuse, a thermistor, or a resistor. The first terminal part 31 is connected to the first pad 21p by solder 6. The second terminal part 32 is connected to the second pad 21q by the solder 6.

The metal plate 4 is a plate-shaped member formed of metal. As illustrated in FIG. 1 and FIG. 2, the metal plate 4 includes a frame part 40 having a flat plate shape and surrounding the electronic component 3. The exemplified frame part 40 has a rectangular frame shape. The frame part 40 is fixed to the flexible printed wiring board 2. As illustrated in FIG. 4, the metal plate 4 is fixed to the flexible printed wiring board 2 to surround the electronic component 3 by the frame part 40. The frame part 40 according to the present embodiment is fixed to the pad 21s by solder 41.

The metal plate 4 reinforces the flexible printed wiring board 2, and protects the electronic component 3 against external stress. The metal plate 4, for example, can regulate bending or stretching of the flexible printed wiring board 2. The metal plate 4 surrounds the electronic component 3, and can suppress interference between the electronic component 3 and other surrounding components.

After the electronic component 3 and the metal plate 4 are attached to the flexible printed wiring board 2, the potting layer 5 is formed. A step of forming the potting layer 5 includes a first application step, a first curing step, a second application step, and a second curing step. The first application step is a step of applying a first potting agent 7, and the first curing step is a step of curing the first potting agent 7. The second application step is a step of applying a second potting agent 8, and the second curing step is a step of curing the second potting agent 8.

As illustrated in FIG. 5 and FIG. 6, a first potting layer 51 is formed to cover at least the solder 6. The first potting layer 51 is a layer formed by the first potting agent 7. The first potting agent 7 has an insulation property, and, for example, is mainly constituted of resin. The first potting agent 7 is, for example, applied by a dispenser. In the present embodiment, the first potting agent 7 is applied to integrally cover the solder 6 and the electronic component 3. The first potting agent 7 is, for example, applied to a region including the electronic component 3, the solder 6, the first pad 21p, and the second pad 21q in a plan view. An application region of the first potting agent 7 is, for example, a rectangular region.

As illustrated in FIG. 6, the first potting agent 7 is applied to have a dome shape. The first potting agent 7 integrally covers an upper surface of the electronic component 3, an outer surface of the solder 6, an upper surface of the first pad 21p, and an upper surface of the second pad 21q. In other words, the electronic component 3, the solder 6, the first pad 21p, and the second pad 21q are shielded from an external space by the first potting agent 7.

After the first application step of applying the first potting agent 7 is completed, the first curing step of curing the first potting agent 7 is performed. The first potting agent 7 may be a thermosetting type, an ultraviolet curing type, an agent to be naturally cured in the air, or an agent to be cured by other means.

When the first potting agent 7 is cured, the second potting agent 8 is applied to form a second potting layer 52. The second potting agent 8 has an insulation property, and, for example, is mainly constituted of resin. The resin of the second potting agent 8 may be different from the resin of the first potting agent 7. For example, the resin of the second potting agent 8 may be harder than the resin of the first potting agent 7 in a case of comparing them in terms of rigidity or elasticity after solidification. The second potting agent 8 can protect the electronic component 3 and the solder 6 against external mechanical stress, water condensation, submersion, humidity, and the like.

As illustrated in FIG. 2, the second potting agent 8 is applied to overlap the first potting agent 7 from the opposite side of the flexible printed wiring board 2. The second potting agent 8 covers the first potting agent 7 and the electronic component 3. The second potting agent 8 according to the present embodiment is applied to be filled in a region surrounded by the frame part 40. The second potting agent 8 is, for example, filled up to an upper surface 40u of the frame part 40. When the second potting agent 8 is completely applied, the first potting agent 7 and the second potting agent 8 are filled in the region surrounded by the frame part 40.

After the second application step of applying the second potting agent 8 is completed, the second curing step of curing the second potting agent 8 is performed. The second potting agent 8 may be a thermosetting type, an ultraviolet curing type, an agent to be naturally cured in the air, or an agent to be cured by other means. When the second potting agent 8 is cured, the potting layer 5 including the first potting layer 51 and the second potting layer 52 is completed. The potting layer 5 covers the electronic component 3 and the solder 6, and protects the electronic component 3 and the solder 6.

The first potting agent 7 according to the present embodiment has higher flexibility as compared with the second potting agent 8. That is, the cured first potting agent 7 is softer than the cured second potting agent 8. The first potting agent 7 after curing may have a smaller modulus of elasticity or lower rigidity as compared with the second potting agent 8 after curing. The first potting agent 7 after curing may have a smaller thermal expansion coefficient as compared with the second potting agent 8 after curing.

The first potting agent 7 having higher flexibility as compared with the second potting agent 8 can appropriately protect an electrical connection part between the electronic component 3 and the flexible printed wiring board 2. The electrical connection part is, for example, the solder 6. In a case in which thermal expansion or thermal contraction is caused in the conductive module 1, the first potting agent 7 can relieve stress acting on the solder 6. As a comparative example, the following examines a potting layer constituted of only the second potting agent 8.

When the potting layer is expanded or contracted by heat, stress acts on the solder 6. When heavy stress acts on the solder 6, deterioration of the solder 6 is easily caused. With the potting layer 5 according to the present embodiment, the stress acting on the solder 6 is reduced as compared with the potting layer according to the comparative example. The first potting agent 7 having high flexibility can absorb stress between the second potting agent 8 and the solder 6. Thus, the conductive module 1 according to the present embodiment can protect the electrical connection part between the electronic component 3 and the flexible printed wiring board 2 to improve reliability.

The first potting agent 7 having a smaller thermal expansion coefficient as compared with the second potting agent 8 can reduce the stress acting on the electrical connection part between the electronic component 3 and the flexible printed wiring board 2.

The thermal expansion coefficient of the first potting agent 7 may have a value closer to the thermal expansion coefficient of the solder 6 as compared with the thermal expansion coefficient of the second potting agent 8. In this case, a difference in an expansion amount or contraction amount between the solder 6 and the first potting agent 7 is reduced. Thus, it is possible to reduce the stress acting on the solder 6 due to thermal expansion or thermal contraction.

As illustrated in FIG. 2, the second potting agent 8 covers the entire first potting agent 7. The second potting agent 8 is harder than the first potting agent 7, and has a high modulus of elasticity and high rigidity. Thus, the second potting agent 8 can protect the electronic component 3 and the solder 6 from external stress. The second potting agent 8, for example, can protect the first potting agent 7, the electronic component 3, and the solder 6 from external impact or vibration. The first potting agent 7 can absorb stress caused by external impact or vibration, and protect the electronic component 3 and the solder 6.

Shapes and application ranges of the first potting layer 51 and the second potting layer 52 are optional. FIG. 7 to FIG. 9 illustrate other examples of the potting layer 5. As illustrated in FIG. 7 and FIG. 8, the first potting agent 7 may be applied to the entire region surrounded by the frame part 40 in a plan view. FIG. 7 illustrates application ranges Ax and Ay of the first potting agent 7. The application range Ax is a range in the first direction X, and is a range from one end to the other end of the region surrounded by the frame part 40. The application range Ay is a range in the second direction Y, and is a range from one end to the other end of the region surrounded by the frame part 40. That is, the first potting agent 7 is applied to cover the entire region surrounded by the frame part 40.

As illustrated in FIG. 8, the first potting agent 7 is applied to have a trapezoidal shape in a lateral view. Both end parts of the first potting layer 51 respectively have oblique surfaces 51a. The first potting agent 7 integrally covers the electronic component 3, the solder 6, the first pad 21p, and the second pad 21q. A width Wx1 of the first potting agent 7 illustrated in FIG. 8 is a width of a portion adjacent to the solder 6, and is a width in the first direction X. The width Wx1 increases as being closer to the flexible printed wiring board 2. In other words, the width Wx1 of the first potting agent 7 increases as being closer to a bottom part of the region surrounded by the frame part 40.

When the first potting agent 7 is cured, the second potting agent 8 is applied. As illustrated in FIG. 9, the second potting agent 8 is applied to the first potting agent 7 from the opposite side of the flexible printed wiring board 2. A width Wx2 of the second potting agent 8 illustrated in FIG. 9 is a width of a portion adjacent to the first potting agent 7, and is a width in the first direction X. The width Wx2 is reduced as being closer to the flexible printed wiring board 2. In other words, the width Wx2 of the second potting agent 8 is reduced as being closer to the bottom part of the region surrounded by the frame part 40.

The width Wx illustrated in FIG. 9 is a width of the potting layer 5, which is equal to a distance from an outer surface of the solder 6 to an inner wall surface of the frame part 40. A ratio of the width Wx1 in the width Wx of the potting layer 5 increases as being closer to the flexible printed wiring board 2. The potting layer 5 configured as described above can appropriately protect the solder 6.

FIG. 10 illustrates another example of the potting layer 5. The first potting agent 7 illustrated in FIG. 10 is applied to cover the entire region surrounded by the frame part 40 in a plan view similarly to the first potting agent 7 illustrated in FIG. 7 to FIG. 9. The first potting agent 7 illustrated in FIG. 10 is applied so that an upper surface 51u of the first potting layer 51 is parallel with the first direction X. The first potting agent 7 is applied so that the upper surface 51u is positioned on an upper side than the entire solder 6. The first potting agent 7 illustrated in FIG. 10 is applied so that the upper surface 51u is positioned on an upper side than the electronic component 3.

The second potting agent 8 is applied to the first potting agent 7 from the opposite side of the flexible printed wiring board 2. The second potting agent 8 is applied in a range from the upper surface 51u of the first potting layer 51 to the upper surface 40u of the frame part 40. The second potting layer 52 illustrated in FIG. 10 is formed to have a uniform thickness.

In the potting layer 5 illustrated in FIG. 10, a gap 43 between the solder 6 and the frame part 40 is filled with the first potting agent 7. That is, a space on a lateral side of the solder 6 is filled with the first potting agent 7 having high flexibility. Thus, the stress acting on the solder 6 is appropriately reduced.

The conductive module 1 including the potting layer 5 according to the present embodiment may also be used as a busbar module. The conductive module 1 illustrated in FIG. 11 is configured as a busbar module. The conductive module 1 is arranged in a battery module 100. The battery module 100 includes a plurality of battery cells 110. The conductive module 1 is placed on the battery cells 110 such that the first direction X of which is aligned with an arrangement direction of the battery cells 110.

The metal plate 4 illustrated in FIG. 11 is a busbar formed of metal having electrical conductivity. The metal plate 4 includes the frame part 40 and a connection part 42. The frame part 40 and the connection part 42, for example, may be integrally formed of the same base metal, or may be formed by joining different members. The shape of the connection part 42 is, for example, a flat plate shape. The connection part 42 projects from the frame part 40 toward the outside of the flexible printed wiring board 2 along the second direction Y. That is, the connection part 42 projects from the frame part 40 toward a lateral side of the flexible printed wiring board 2.

The connection part 42 is connected to two electrodes 120. One of the electrodes 120 is an electrode included in one of the battery cells 110, and the other one of the electrodes 120 is an electrode included in the other one of the battery cells 110. The two electrodes 120 may be a combination of an anode and a cathode.

The frame part 40 illustrated in FIG. 11 is electrically connected to the second pad 21*q*. That is, the metal plate 4 in FIG. 11 connects the second terminal part 32 of the electronic component 3 to the electrode 120. In this case, the first terminal part 31 of the electronic component 3 may be connected to a control unit that monitors a state of the battery module 100. The electronic component 3 is, for example, a chip fuse.

In the conductive module 1 illustrated in FIG. 11, the metal plate 4 has a plurality of functions. One of the functions is a function as a busbar. The other one of the functions is a function as a reinforcing component of the flexible printed wiring board 2. The further other one of the functions is a function of housing the potting layer 5. Thus, the number of components can be reduced as compared with a case in which a reinforcing plate different from the metal plate 4 is used for the conductive module 1. The conductive module 1 may also include a case that houses the flexible printed wiring board 2 and the metal plate 4.

The electronic component 3 mounted on the flexible printed wiring board 2 is not limited to the fuse. The electronic component 3 may also be a thermistor that detects a temperature of the battery cell 110. In this case, the frame part 40 may be not necessarily connected to the electronic component 3, and the metal plate 4 may be not limited to the busbar. The electronic component 3 may be a chip resistor, or may be another electronic component.

A plurality of the electronic components 3 may be mounted on the flexible printed wiring board 2. In this case, the different metal plates 4 may be arranged for the respective electronic components 3. The plural electronic components 3 may include different components. For example, part of the plural electronic components 3 may be chip fuses, and the other part of the electronic components 3 may be thermistors.

The one frame part 40 may surround a plurality of the electronic components 3. For example, the one frame part 40 may surround the chip fuse and the thermistor. In this case, the potting layer 5 filled in the frame part 40 preferably covers both of the chip fuse and the thermistor. It is preferable that the first potting agent 7 covers an electrical connection part between the chip fuse and the flexible printed wiring board 2, and further covers an electrical connection part between the thermistor and the flexible printed wiring board 2.

As described above, the conductive module 1 according to the present embodiment includes the flexible printed wiring board 2, the electronic component 3, the first potting agent 7, and the second potting agent 8. The electronic component 3 is mounted on the flexible printed wiring board 2, and connected to the circuit pattern 21*a* of the flexible printed wiring board 2. The first potting agent 7 covers the connection part between the electronic component 3 and the flexible printed wiring board 2. The second potting agent 8 overlaps the first potting agent 7 from the opposite side of the flexible printed wiring board 2. The second potting agent 8 covers the first potting agent 7 and the electronic component 3.

The first potting agent 7 has higher flexibility as compared with the second potting agent 8. In the conductive module 1 according to the present embodiment, the first potting agent 7 having high flexibility covers the connection part between the electronic component 3 and the flexible printed wiring board 2. The first potting agent 7 can absorb stress between the second potting agent 8 and the connection part. Thus, the conductive module 1 according to the present embodiment can appropriately protect the connection part between the electronic component 3 and the flexible printed wiring board 2.

The first potting agent 7 according to the present embodiment integrally covers the connection part between the electronic component 3 and the flexible printed wiring board 2, and the electronic component 3. Thus, the first potting agent 7 can appropriately protect both of the electronic component 3 and the electrical connection part.

The conductive module 1 according to the present embodiment includes the metal plate 4. The metal plate 4 includes the frame part 40 surrounding the electronic component 3, and the frame part 40 is fixed to the flexible printed wiring board 2. The region surrounded by the frame part 40 is filled with the first potting agent 7 and the second potting agent 8. The metal plate 4 can reinforce the flexible printed wiring board 2 to protect the electronic component 3 and the electrical connection part from external stress.

The first potting agent 7 may be filled to cover the entire region surrounded by the frame part 40 in a plan view to form the first potting layer 51. The second potting agent 8 may be filled to overlap the first potting layer 51 to form the second potting layer 52. The first potting agent 7 filled to cover the entire region surrounded by the frame part 40 can appropriately protect the electronic component 3 and the electrical connection part.

The conductive module 1 may not include the metal plate 4. That is, the potting layer 5 may include the first potting layer 51 formed to cover the connection part between the electronic component 3 and the flexible printed wiring board 2, and the second potting layer 52 formed to cover the first potting layer 51. In this case, the second potting layer 52 may be applied to have a trapezoidal shape in a lateral view like the first potting layer 51 illustrated in FIG. 8.

The flexible printed wiring board 2 may not include a plurality of the conductive layers 21 and 22. For example, the flexible printed wiring board 2 may not include the second conductive layer 22 and the second coverlay 20*c*.

The first potting agent 7 may be applied to expose part of the electronic component 3. For example, a top part of the electronic component 3 may be exposed from the first potting layer 51. The first potting agent 7 may be dividedly applied in two or more regions. For example, the first potting agent 7 may be dividedly applied in one portion that covers the solder 6 and the other one portion that covers the solder 6.

The connection part connecting the electronic component 3 to the flexible printed wiring board 2 is not limited to the solder 6. The electronic component 3 may be joined to the circuit pattern 21*a* of the flexible printed wiring board 2 using a method different from soldering.

Pieces of the content disclosed in the embodiment described above can be appropriately combined to be implemented.

The conductive module according to the present embodiment includes a first potting agent that covers the connection part between the electronic component and the flexible printed wiring board, and a second potting agent that overlaps the first potting agent from the opposite side of the flexible printed wiring board to cover the first potting agent and the electronic component. The first potting agent has higher flexibility as compared with the second potting agent. The conductive module according to the present embodiment exhibits an effect of protecting the connection part between the electronic component and the flexible printed wiring board by the first potting agent having high flexibility.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. A conductive module comprising:
a flexible printed wiring board;
an electronic component that is mounted on the flexible printed wiring board and connected to a circuit pattern of the flexible printed wiring board;
a first potting agent that covers a connection part between the electronic component and the flexible printed wiring board; and
a second potting agent that directly contacts and overlaps the first potting agent from the opposite side of the flexible printed wiring board, and covers the first potting agent and the electronic component, wherein
the first potting agent has higher flexibility as compared with the second potting agent.

2. The conductive module according to claim 1, wherein the first potting agent integrally covers the connection part and the electronic component.

3. The conductive module according to claim 2, further comprising:
a metal plate that includes a frame part surrounding the electronic component and being fixed to the flexible printed wiring board, wherein
a region surrounded by the frame part is filled with the first potting agent and the second potting agent.

4. The conductive module according to claim 3, wherein
the first potting agent is filled to cover the entire region surrounded by the frame part in a plan view to form a first potting layer, and
the second potting agent is filled to overlap the first potting layer to form a second potting layer.

5. The conductive module according to claim 3, wherein
the metal plate is a conductive busbar including a connection part fixed to a battery cell,
the connection part projects from the frame part toward a lateral side of the flexible printed wiring board, and
the frame part is connected to the circuit pattern.

6. The conductive module according to claim 1, further comprising:
a metal plate that includes a frame part surrounding the electronic component and being fixed to the flexible printed wiring board, wherein
a region surrounded by the frame part is filled with the first potting agent and the second potting agent.

7. The conductive module according to claim 6, wherein
the first potting agent is filled to cover the entire region surrounded by the frame part in a plan view to form a first potting layer, and
the second potting agent is filled to overlap the first potting layer to form a second potting layer.

8. The conductive module according to claim 6, wherein
the metal plate is a conductive busbar including a connection part fixed to a battery cell,
the connection part projects from the frame part toward a lateral side of the flexible printed wiring board, and
the frame part is connected to the circuit pattern.

* * * * *